(12) United States Patent
Kuriyama

(10) Patent No.: US 8,120,130 B2
(45) Date of Patent: Feb. 21, 2012

(54) SOLID-STATE IMAGING DEVICE AND METHOD FOR MANUFACTURING THE SAME

(75) Inventor: Toshihiro Kuriyama, Shiga (JP)

(73) Assignee: Panasonic Corporation, Osaka (JP)

( * ) Notice: Subject to any disclaimer, the term of this patent is extended or adjusted under 35 U.S.C. 154(b) by 125 days.

(21) Appl. No.: 12/140,669

(22) Filed: Jun. 17, 2008

(65) Prior Publication Data
US 2008/0315262 A1    Dec. 25, 2008

(30) Foreign Application Priority Data

Jun. 21, 2007  (JP) ................................ 2007-164129
Mar. 19, 2008  (JP) ................................ 2008-071844

(51) Int. Cl.
*H01L 27/146* (2006.01)

(52) U.S. Cl. ........ 257/437; 257/431; 257/435; 257/443; 257/446; 257/448; 257/E31.111; 257/E31.113

(58) Field of Classification Search .................. 257/431, 257/435, 443, 444, 446, 447, 448, E31.111, 257/113
See application file for complete search history.

(56) References Cited

U.S. PATENT DOCUMENTS

2002/0003230 A1 *   1/2002  Maruyama ...................... 257/53
2006/0022235 A1 *   2/2006  Kanbe ........................... 257/294

FOREIGN PATENT DOCUMENTS

JP          5-243537        9/1993

* cited by examiner

*Primary Examiner* — Minchul Yang
(74) *Attorney, Agent, or Firm* — Hamre, Schumann, Mueller & Larson, P.C.

(57) ABSTRACT

It is an object of the present invention to provide a solid-state imaging device that can achieve a high sensitivity, finer pixels for increasing the number of pixels, a high-speed operation, and high image quality, and a method for manufacturing the same. There are provided a plurality of photoelectric conversion portions arranged in a matrix on a substrate, a vertical transfer channel arranged between vertical columns of the photoelectric conversion portions, a plurality of vertical transfer electrodes for transferring a charge of the photoelectric conversion portions to the vertical transfer channel, a light-shielding film that is laminated on the vertical transfer electrodes via a first insulating film and has a plurality of window portions, each defining a light-receiving portion of each of the photoelectric conversion portions, and a shunt wiring that is arranged in a region overlapping the vertical transfer channel and is insulated from the light-shielding film by a second insulating film. A driving pulse according to a drive phase of each of the vertical transfer electrodes is supplied from the shunt wiring.

10 Claims, 13 Drawing Sheets

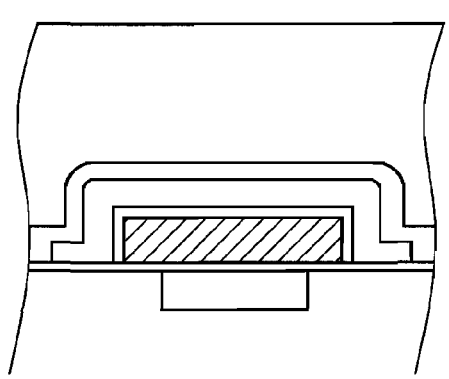
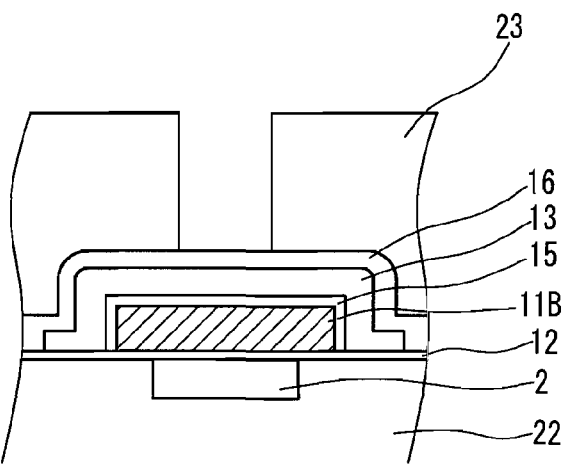
FIG. 3A              FIG. 3B
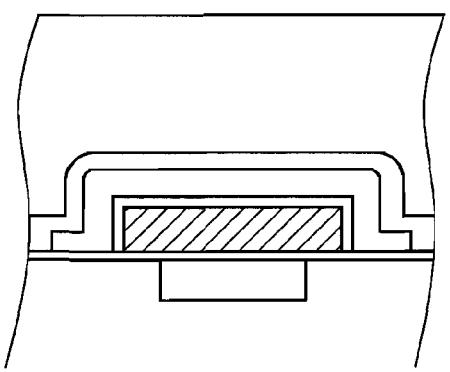
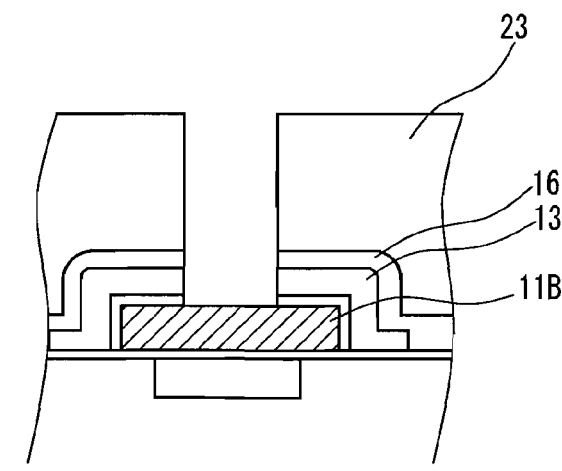
FIG. 3C              FIG. 3D

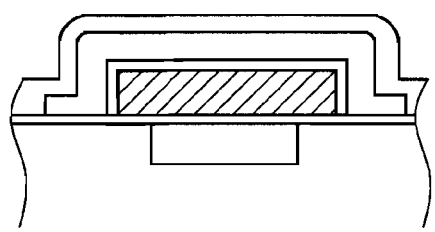
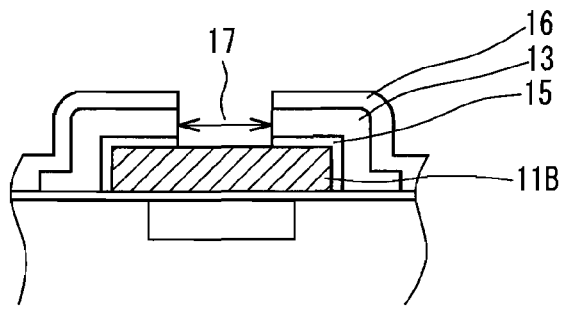
FIG. 4A  FIG. 4B
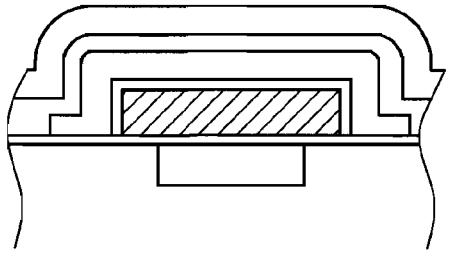
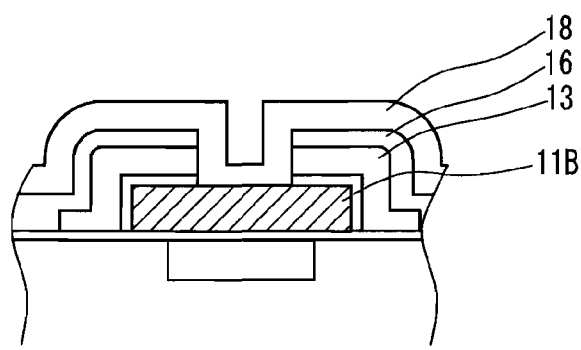
FIG. 4C  FIG. 4D
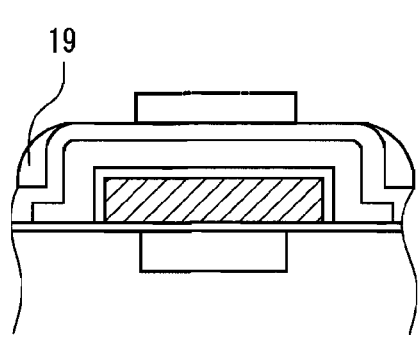
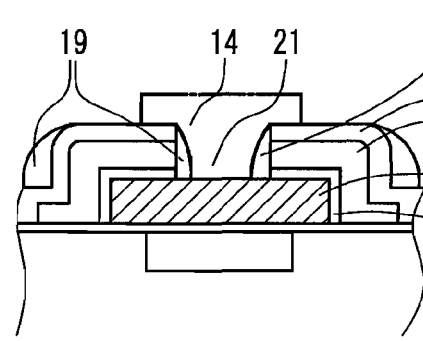
FIG. 4E  FIG. 4F

SOLID-STATE IMAGING DEVICE AND METHOD FOR MANUFACTURING THE SAME

BACKGROUND OF THE INVENTION

1. Field of the Invention

The present invention relates to a solid-state imaging device, in particular, a solid-state imaging device in which a driving pulse is applied to a vertical transfer electrode via a shunt wiring, and a method for manufacturing the same. More specifically, the present invention relates to a shape of a light-shielding film and a method for connecting the shunt wiring and the vertical transfer electrode.

2. Description of Related Art

In recent years, demands for solid-state imaging devices have been increasing as imaging devices for use in digital still cameras and digital video cameras. Further, due to a request that portable terminal devices such as a cellphone additionally have a camera function, the demands for solid-state imaging devices have been expanded. Along with this, there also is a growing demand for high-quality images. In order to enhance the image quality of a solid-state imaging device, it is required both to increase the number of pixels and to improve the sensitivity by increasing the S/N ratio.

A prerequisite for increasing the number of pixels of a solid-state imaging device is to enhance the operating speed of the solid-state imaging device. In order to enhance the operating speed of a CCD (Charge Coupled Device) solid-stage imaging device, it is required to transfer signal charges from an imaging portion to a charge accumulating portion at a high speed.

To achieve a high charge transfer rate, it has been proposed to connect corresponding vertical transfer electrodes with a common shunt wiring that also serves as a light-shielding film, thereby reducing the influence of an electrical resistance of the vertical transfer electrodes. Here, in many cases, an aluminum film, which is a preferable material for use in the shunt wiring that also serves as a light-shielding film, is formed on a flattening film since it is difficult for it to be formed in a step portion. When a light-shielding film is formed on a flattening film, it is necessary to prevent smear that occurs due to oblique incident light that cannot be blocked. To this end, in addition to the shunt wiring made of an aluminum film that also serves as a light-shielding film, another light-shielding film made of a high melting point metal such as tungsten is formed so as to cover a side wall portion of the vertical transfer electrode, as disclosed in JP H5 (1993)-243537 A, for example.

FIG. 12 is an enlarged view showing a planar configuration of an imaging portion of such a conventional solid-state imaging device. FIGS. 13A-B are enlarged cross-sectional views of portions where a shunt wiring that also serves as a light-shielding film is formed in the conventional solid-state imaging device. FIG. 13A shows a cross-sectional structure taken along a line a-a in FIG. 12, and FIG. 13B shows a cross-sectional structure taken along a line b-b in FIG. 12.

As shown in FIGS. 12 and 13A-B, the imaging portion of the conventional solid-state imaging device includes a plurality of photoelectric conversion portions 101 formed in a matrix on a semiconductor substrate 122 and a plurality of vertical transfer channels 102 formed so as to extend in a column direction, i.e., a vertical direction in FIG. 12, between the photoelectric conversion portions 101 adjacent in a row direction, i.e., a horizontal direction in FIG. 12.

Further, a pair of vertical transfer electrodes 111A and 111B extending in the row direction are formed so as to sandwich each of the photoelectric conversion portions 101 in the column direction. The vertical transfer electrodes 111A and 111B respectively have downward and upward protruding portions in FIG. 12 in portions between vertical columns of the photoelectric conversion portions, i.e., regions where the vertical transfer channels 102 are formed. The protruding portions have their ends overlapping each other, with an insulating film not shown interposed therebetween.

One light-shielding film 113A is formed so as to cover vicinities of end portions and side wall portions of the protruding portions of the vertical transfer electrodes 111A and 111B on the left side in FIG. 12, and another light-shielding film 113B is formed so as to cover vicinities of end portions and side wall portions of the protruding portions of the vertical transfer electrodes 111A and 111B on the right side in FIG. 12. A first insulating film 115 is formed between the vertical transfer electrode 111 and the light-shielding film 113.

On the light-shielding film 113, a shunt wiring 114 that also serves as a light-shielding film is formed via a second insulating film 116 so as to cover the vertical transfer channel 102. The shunt wiring 114 that also serves as a light-shielding film is connected to the corresponding vertical transfer electrode 111 with a contact portion 121. The contact portion 121 is made of the same metal material as that for the shunt wiring 114 that also serves as a light-shielding film, and is formed by a sputtering method simultaneously with the shunt wiring 114.

In the example shown in FIG. 12, the vertical transfer electrode 111B arranged below the central upper photoelectric conversion portion 101 in the figure is connected to the shunt wiring 114 that also serves as a light-shielding film on the right side in the figure, and the vertical transfer electrode 111A arranged above the central lower photoelectric conversion portion 101 in the figure is connected to the shunt wiring 114 that also serves as a light-shielding film on the left side in the figure. A driving pulse for transferring a charge obtained by photoelectric conversion is applied directly to the vertical transfer electrode 111.

In the conventional solid-state imaging device as described above, since the shunt wiring 114 that also serves as a light-shielding film is connected electrically to the corresponding vertical transfer electrode 111 with the contact portion 121, the shunt wiring functions as a pulse transmission line, contributing to a lower resistance of the vertical transfer electrode. Accordingly, a delay in propagating signal charges can be suppressed, especially in a central portion of the solid-state imaging device, as compared with the case where a driving pulse for photoelectric conversion and charge transport is applied using only the vertical transfer electrode 111. As a result, it is possible to realize a solid-state imaging device that can be operated at a higher speed.

However, although the above-described conventional solid-state imaging device can be operated at a high speed, it has a problem with a withstand voltage between the light-shielding film 113 and the contact portion 121 formed simultaneously with the shunt wiring 114 that also serves as a light-shielding film, as pixels become finer.

More specifically, the electrical withstand voltage between the light-shielding film 113 and the contact portion 121 is defined by a distance between these two metal members, and a portion with the smallest distance cis a problem. For example, as shown in FIG. 13B, it is assumed that t1 and t2 represent the distances on the left side and the right side, respectively, in the figure. In the case of FIG. 13B where t1<t2, the distance between the light-shielding film 113A positioned on the left side of the vertical transfer electrode 111 and the contact portion 121 is a problem.

Since the contact portion 121 is manufactured simultaneously with the shunt wiring 114 that also serves as a light-shielding film by a sputtering method or the like as described above, there is a certain limit to the accuracy of its forming position due to variations during a manufacturing process. However, to ensure such design dimensions that can absorb variations during a manufacturing process, the light-receiving portion has a smaller area, and the effective sensitivity is reduced, resulting in a lower S/N ratio. On the other hand, to ensure that the light-receiving portion has a sufficient area, pixels have to be made larger. Accordingly, it is impossible to achieve finer pixels, contrary to the request for a solid-state imaging element to have an increased number of pixels.

Further, according to the above-described conventional solid-state imaging device, although the vertical transfer electrodes are joined with the shunt wiring, thereby decreasing their electrical resistance, a signal for charge transfer is applied from the vertical transfer electrodes. Therefore, a path that allows the charge transfer signal to pass through the vertical transfer electrodes cannot be made shorter, and thus a sufficient high-speed operation cannot be achieved.

SUMMARY OF THE INVENTION

The present invention has been conceived to solve the conventional problems as described above, and it is an object of the present invention to provide a solid-state imaging device that can achieve a high sensitivity, finer pixels for increasing the number of pixels, a high-speed operation, and high image quality, and a method for manufacturing the same.

In order to solve the above-described problems, a solid-state imaging device according to the present invention includes: a plurality of photoelectric conversion portions arranged in a matrix on a substrate; a vertical transfer channel arranged between vertical columns of the photoelectric conversion portions; a plurality of vertical transfer electrodes for transferring a charge of the photoelectric conversion portions to the vertical transfer channel; a light-shielding film that is laminated on the vertical transfer electrodes via a first insulating film and has a plurality of window portions, each defining a light-receiving portion of each of the photoelectric conversion portions; and a shunt wiring that is arranged in a region overlapping the vertical transfer channel and is insulated from the light-shielding film by a second insulating film. A driving pulse according to a drive phase of each of the vertical transfer electrodes is supplied from the shunt wiring.

A method for manufacturing a solid-state imaging device according to the present invention is a method for manufacturing a solid-state imaging device including: a plurality of photoelectric conversion portions arranged in a matrix on a substrate; a vertical transfer channel arranged between vertical columns of the photoelectric conversion portions; vertical transfer electrodes connected to the plurality of photoelectric conversion portions aligned in a horizontal direction; a light-shielding film that is laminated on the vertical transfer electrodes via a first insulating film and has a plurality of window portions, each defining a light-receiving portion of each of the photoelectric conversion portions; and a shunt wiring that is arranged in a region overlapping the vertical transfer channel and is insulated from the light-shielding film by a second insulating film. The method includes the steps of: etching the second insulating film, the light-shielding film, and the first insulating film after the formation of the second insulating film so as to form an opening with a predetermined shape in a region overlapping the vertical transfer channel; forming a third insulating film and subjecting the same to anisotropic etching so as to form a side wall in the opening; and forming the shunt wiring integrally with a leg portion extending in a thickness direction of the shunt wiring, so that the shunt wiring is connected to one of the vertical transfer electrodes with the leg portion.

Therefore, according to the solid-state imaging device and the method for manufacturing the same according to the present invention, a driving pulse is applied to the vertical transfer electrode from the shunt wiring laminated on the light-shielding film that defines the light-receiving portion of the photoelectric conversion portion. Consequently, the influence of the electrical resistance on the driving pulse can be reduced significantly. Further, since the shunt wiring is formed on the second insulating film, electrical interference between the shunt wiring and the other metal thin films can be suppressed, and a margin in the process of manufacturing the light-shielding film and the shunt wiring can be minimized. As a result, it is possible to provide a solid-state imaging device that can achieve a high sensitivity, finer pixels for increasing the number of pixels, a high-speed operation, and high image quality.

Preferably, in the above-described solid-state imaging device according to the present invention, the vertical transfer electrodes are connected to the plurality of photoelectric conversion portions aligned in a horizontal direction, and the shunt wiring is connected to one of the vertical transfer electrodes with a leg portion that extends in a thickness direction of the shunt wiring integrally with the shunt wiring.

Therefore, the shunt wiring and the vertical transfer electrode can be connected easily and reliably.

Preferably, the light-shielding film is formed also in a region overlapping the shunt wiring, except for a connection opening through which the leg portion penetrates, and the connection opening has any one of a circular shape, an elliptical shape, and a rectangular shape.

Therefore, a leak of unwanted external light incident on the photoelectric conversion portion can be prevented effectively.

Preferably, the leg portion is positioned at a center of the connection opening.

Therefore, electrical interference between the shunt wiring and the light-shielding film can be prevented reliably.

Preferably, the light-shielding film is divided by a slit portion formed in the region overlapping the vertical transfer channel with respect to each of the vertical columns of the photoelectric conversion portions, and the leg portion is formed continuously in a direction in which the shunt wiring is arranged and enters the slit portion.

Therefore, it is possible to reduce film peeling of the shunt wiring.

Preferably, a side wall is formed on a side surface of the connection opening in the light-shielding film or a side surface of the slit portion in the light-shielding film in its long side direction.

Therefore, the leg portion integral with the shunt wiring can be formed at a predetermined position easily.

Preferably, a stopper layer is laminated on the vertical transfer electrodes corresponding to a bottom of the slit portion, except for a connecting portion between the shunt wiring and one of the vertical transfer electrodes.

Therefore, it is possible to prevent easily and reliably unwanted connection between the shunt wiring and the vertical transfer electrode that do not correspond to each other.

Preferably, an antireflection film made of the same material as that for the stopper layer is formed in the light-receiving portion, and the vertical transfer electrodes have a single layer structure.

Preferably, in the above-described method for manufacturing a solid-state imaging device according to the present invention, the opening has any one of a circular shape, an elliptical shape, and a rectangular shape, and the opening has a slit shape extending in a direction in which the vertical transfer channel is formed. Further, preferably, the first insulating film is a multilayer film formed by laminating a silicon nitride film on a silicon oxide film.

BRIEF DESCRIPTION OF THE DRAWINGS

FIG. 2A shows a cross-sectional configuration taken along a line A-A in FIG. 1, and FIG. 2B shows a cross-sectional configuration taken along a line B-B in FIG. 1.

FIGS. 3A-D are cross-sectional configuration views for illustrating a method for manufacturing the solid-state imaging device according to the first embodiment of the present invention.

FIGS. 4A-F are cross-sectional configuration views subsequent to FIGS. 3A-D for illustrating the method for manufacturing the solid-state imaging device according to the first embodiment of the present invention.

FIG. 7A shows a cross-sectional configuration taken along a line C-C in FIG. 6, and FIG. 7B shows a cross-sectional configuration taken along a line D-D in FIG. 6.

FIG. 11A shows a cross-sectional configuration taken along a line E-E in FIG. 10, and FIG. 11B shows a cross-sectional configuration taken along a line F-F in FIG. 10.

FIG. 13A shows a cross-sectional configuration taken along a line a-a in FIG. 12, and FIG. 13B shows a cross-sectional configuration taken along a line b-b in FIG. 12.

DETAILED DESCRIPTION OF THE INVENTION

Hereinafter, embodiments of the solid-state imaging device and the method for manufacturing the same according to the present invention will be described with reference to the drawings.

First Embodiment

Figure 1:
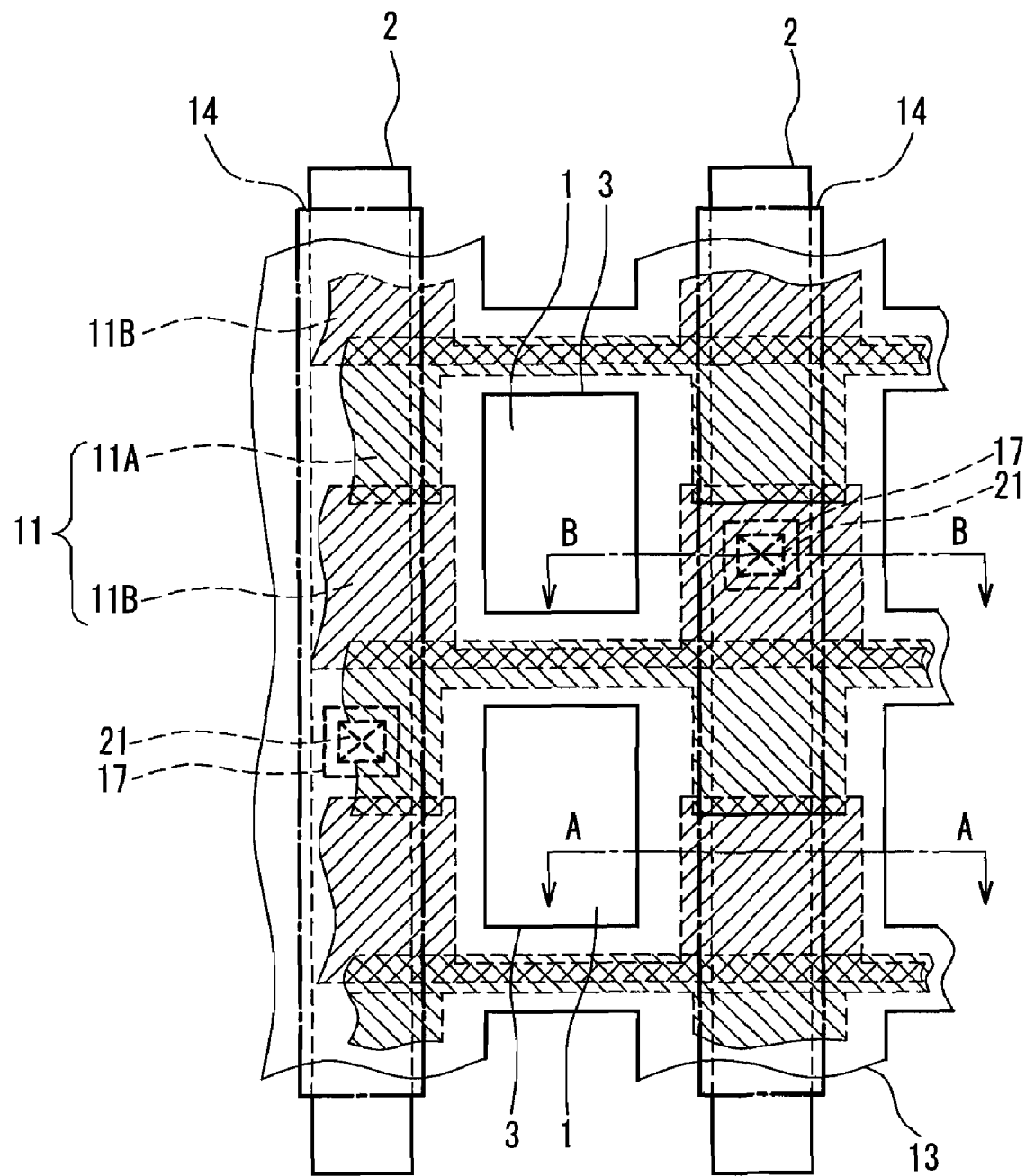
FIG. 1 is a plan view showing a configuration of an imaging portion of a solid-state imaging device according to a first embodiment of the present invention.
Figure 2A:
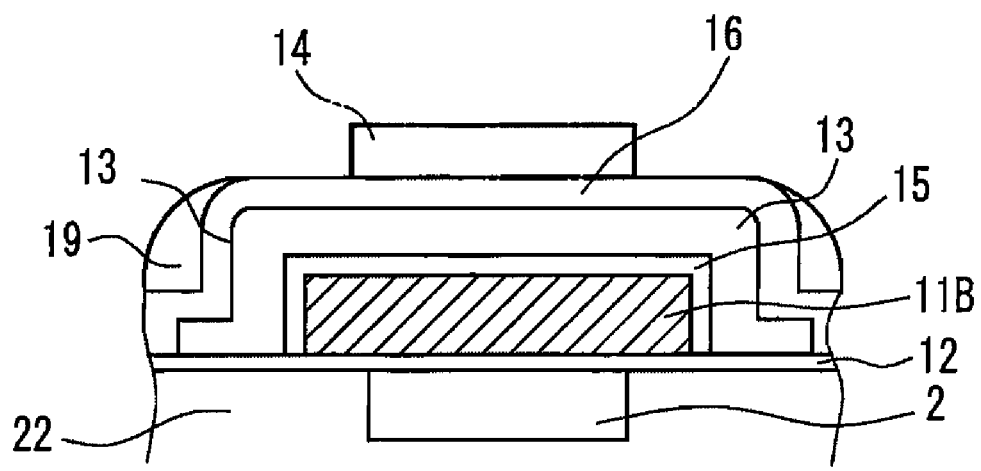
FIGS. 2A-B are schematic views showing cross-sectional configurations of the imaging portion of the solid-state imaging device according to the first embodiment of the present invention.

A first embodiment of the present invention will be described with reference to the drawings. FIG. 1 is a plan view illustrating a main configuration of an imaging portion of a solid-state imaging device according to the first embodiment of the present invention. FIG. 2A is a schematic view showing a cross-sectional configuration taken along a line A-A in FIG. 1, and FIG. 2B is a schematic view showing a cross-sectional configuration taken along a line B-B in FIG. 1.

Figure 2B:
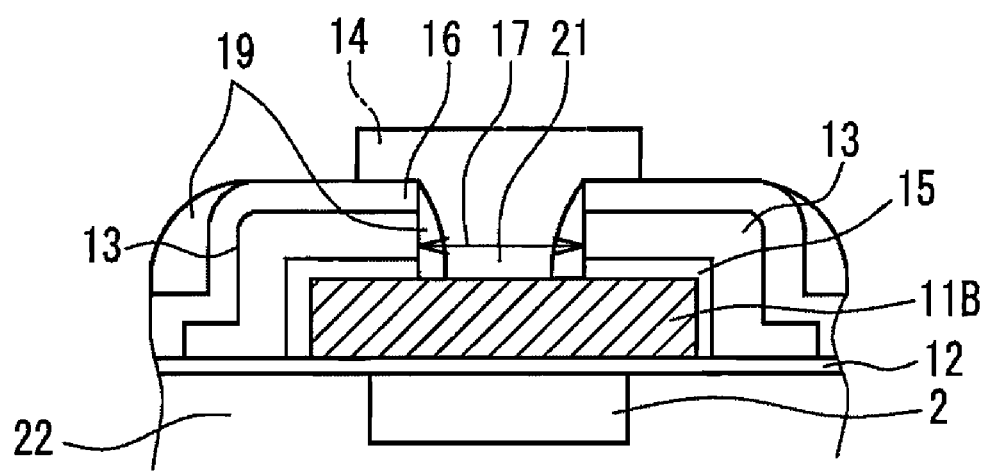

As shown in FIGS. 1 and 2A-B, the imaging portion of the solid-state imaging device of the present embodiment includes photoelectric conversion portions 1 as photodiodes formed in a matrix on a semiconductor substrate 22, and vertical transfer channels 2 as impurity diffusion layers formed in portions between vertical columns (hereinafter, referred to as "vertical inter-column portions") of the photoelectric conversion portions 1, i.e., portions between the photoelectric conversion portions 1 aligned in a horizontal direction.

On a surface oxide film 12 formed on a surface of the semiconductor substrate 22, vertical transfer electrodes 11 made of polysilicon for transferring charges obtained by the photoelectric conversion portions 1 to the vertical transfer channels 2 are formed in portions between horizontal rows (hereinafter, referred to as "horizontal inter-row portions") of the photoelectric conversion portions 1, i.e., portions between the photoelectric conversion portions 1 aligned in a vertical direction. The vertical transfer electrodes 11 are connected to the plurality of photoelectric conversion portions.

Each of the vertical transfer electrodes 11 in the present embodiment is composed of a first vertical transfer electrode 11A formed in an upper horizontal inter-row portion of the corresponding photoelectric conversion portion 1 in FIG. 1 and a second vertical transfer electrode 11B formed in a lower horizontal inter-row portion of the corresponding photoelectric conversion portion 1 in FIG. 1, and these two vertical transfer electrodes are provided so as to sandwich the photoelectric conversion portion 1 therebetween. Further, in the vertical inter-column portions of the photoelectric conversion portions 1, the first vertical transfer electrode 11A and the second vertical transfer electrode 11B respectively have protruding portions formed so as to surround the corresponding photoelectric conversion portion 1 from both side surfaces thereof, the corresponding photoelectric conversion portion 1 being positioned below the first vertical transfer electrode 11A and above the second vertical transfer electrode 11B in FIG. 1. The vertical transfer channels 2 and the vertical transfer electrodes 11 form vertical transfer resistors for reading out charges of the photoelectric conversion portions 1 and transferring them in a vertical column direction. It should be understood that in a portion where the first vertical transfer electrode 11A and the second vertical transfer electrode 11B overlap each other, an insulating layer is interposed therebetween, so that no electrical continuity is established between these two vertical transfer electrodes.

On a first insulating film 15 formed on the vertical transfer electrodes 11, a light-shielding film 13 made of tungsten (W) is formed. In the solid-state imaging device according to the present embodiment, the light-shielding film 13 is formed also in a region where a shunt wiring 14 to be described later is formed, except for a connection opening 17 through which a leg portion 21 for connecting the shunt wiring 14 and the vertical transfer electrode 11 penetrates. Further, the light-shielding film 13 has window portions 3, each being an opening with a predetermined shape, in portions corresponding to the respective photoelectric conversion portions 1. Namely, in the solid-state imaging device according to the present embodiment, the light-shielding film 13 is formed so as to cover substantially the entire surface of an imaging region where the photoelectric conversion portions 1 of the solid-state imaging device are formed, except for the window portions. Each of the window portions 3 of the light-shielding film 13 defines a light-receiving portion of each of the photoelectric conversion portions 1.

A second insulating film 16 is formed on the light-shielding film 13. On the second insulating film 16, the shunt wirings 14 made of tungsten (W) are formed in regions overlapping the vertical transfer channels 2, i.e., portions corresponding to the vertical inter-column portions of the photoelectric conversion portions 1. Each of the shunt wirings 14 is connected to the corresponding vertical transfer electrode 11 so as to supply a driving pulse to the vertical transfer electrode 11.

For example, in the solid-state imaging device shown in FIG. 1, the shunt wiring 14 on the right side in the figure is connected to the second vertical transfer electrode 11B positioned below the central upper photoelectric conversion portion 1 in the figure, with the leg portion 21 as a connection. Further, the shunt wiring 14 on the left side in the figure is connected to the first vertical transfer electrode 11A positioned above the central lower photoelectric conversion portion 1 in the figure, with the leg portion 21 as a connection. In this manner, the different shunt wirings are connected to the different vertical transfer electrodes 11. When vertical driving pulses are applied to the vertical transfer electrodes 11 via the shunt wirings 14, the vertical transfer electrodes 11 are driven so as to read out charges from the photoelectric conversion portions 1 and transfer them in the column direction. A pair of the shunt wiring 14 and the vertical transfer electrode 11 to be connected to each other is different depending on the drive phase of the solid-state imaging device. In the case of the four-phase drive, for example, four adjacent shunt wirings are connected respectively to different vertical transfer electrodes.

On the shunt wirings 14, an interlayer insulating film, a color layer, an on-chip lens, and the like are formed as upper layers. These upper layers have the same configurations as those in a usual solid-state imaging device, and thus they are not shown in the figure and descriptions thereof will be omitted. The dimension of each of the shunt wirings 14 in a width direction, i.e., a row direction of the solid-state imaging device is equal to or smaller than the dimension of the light-shielding film 13 formed between the vertical columns of the photoelectric conversion portions 1, so that light can be incident on the light-receiving portion without being blocked by the shunt wiring 14.

Next, a connecting portion between the shunt wiring 14 and the vertical transfer electrode 11 will be described.

As shown in FIGS. 1 and 2B, in the connecting portion between the shunt wiring 14 and the vertical transfer electrode 11B, the connection opening 17 with a substantially square shape is formed in the light-shielding film 13, and the leg portion 21 is provided that extends in a thickness direction of the shunt wiring 14, i.e., the vertical direction in FIG. 2B, integrally with the shunt wiring so as to penetrate the connection opening 17. As is evident from FIG. 2B, the leg portion 21 also penetrates the first insulating film 15 and the second insulating film 16 so as to be in contact with the second vertical transfer electrode 11B, thereby establishing electrical continuity between the second vertical transfer electrode 11B and the shunt wiring 14.

In order to avoid contact and continuity between the leg portion 21 and the light-shielding film 13, the leg portion 21 preferably is positioned at the center of the connection opening 17 in the light-shielding film 13. Although the second insulating film 16 is formed within the connection opening 17 in the light-shielding film 13, electrical continuity might be established between the leg portion 21 and the light-shielding film 13 even in the presence of the second insulating film 16 when the leg portion 21 is positioned too close to the light-shielding film 13. Such electrical continuity is established in a portion where a distance between the light-shielding film 13 and the leg portion 21 is the smallest. Thus, when the leg portion 21 is positioned at the center of the connection opening 17, the smallest distance between the leg portion 21 and the light-shielding portion 13 can be maximized.

A specific operating state of the solid-state imaging element according to the present embodiment is as follows. The light-shielding film 13 is connected to the ground GND (0 V), and the leg portion 21 of the shunt wiring 14 is connected to the vertical transfer electrode. Thus, voltages to be applied are High: 0 V and Low: −6 V as pulses for vertical transfer and 12 V for readout. Accordingly, a required withstand voltage between the light-shielding film 13 and the leg portion 21 is 12 V or more. Assuming that the second insulating film 16 has a withstand voltage of 2 MV/cm, its film thickness, in other words, the distance between the light-shielding film 13 and the leg portion 21 has to be 60 nm or more.

As described above, in order to ensure the distance between the light-shielding film 13 and the leg portion 21, the leg portion 21 preferably is positioned at the center of the connection opening 17 in the light-shielding film 13. To this end, it is effective to form a side wall within the connection opening 17 in the light-shielding film 13. Hereinafter, a description will be given of a method in which such a side wall is formed in an inner wall portion of the connection opening 17 in the light-shielding film 13, followed by integral formation of the shunt wiring 14 and the leg portion 21, with reference to FIGS. 3A-D and 4A-F. In the following description, the insulating films that affect insulation between the light-shielding film 13 and the shunt wiring 14 as well as the leg portion 21 will be described with reference to exemplary specific numerical values that represent their thicknesses and the like.

FIGS. 3A-D and 4A-F are cross-sectional configuration views for illustrating a method for manufacturing the solid-state imaging device according to the present invention. FIGS. 3A, 3C, 4A, 4C, and 4E show cross-sectional configurations of a portion other than the connecting portion between the shunt wiring 14 and the second vertical transfer electrode 11B, taken along a line A-A in FIG. 1. FIGS. 3B, 3D, 4B, 4D, and 4F show cross-sectional configurations of the connecting portion between the shunt wiring 14 and the second vertical transfer electrode 11B where the leg portion 21 is formed, taken along a line B-B in FIG. 1.

In the states shown in FIGS. 3A and 3B, manufacturing processes already have been conducted up to the formation of the second insulating film 16. More specifically, on the semi-conductor substrate 22, the photoelectric conversion portion not shown and the vertical transfer channel 2 in the vertical inter-column portion of the photoelectric conversion portion have been formed, on which the vertical transfer electrode 11 (11B) has been formed in a predetermined pattern via the surface oxide film 12, and the first insulating film 15, the light-shielding film 13 with a window portion 3, and the second insulating film 16 have been formed. In the present embodiment, the second insulating film 16 has a thickness of 100 nm.

As shown in FIGS. 3A and 3B, a resist film 23 is formed on the second insulating film 16. As shown in FIG. 3B, the resist film 23 corresponding to the portion where the connection opening 17 in the light-shielding film 13 is formed later as the connecting portion between the shunt wiring 14 and the vertical transfer electrode 11 is patterned and removed. In the present embodiment, the removal pattern of the resist film 23 has a size of 300 nm square, for example. Thus, the patterning can be performed easily by commonly used photolithography using an exposure mask, for example.

Then, as shown in FIGS. 3C and 3D, the resist film 23 is used as a mask so as to form an opening in the second interlayer insulating film 16, the light-shielding film 13, and the first interlayer insulating film 15.

Thereafter, as shown in FIGS. 4A and 4B, the resist film 23 is removed. Here, the opening formed in the light-shielding film 13 serves as the connection opening 17 in the light-shielding film 13.

After that, as shown in FIGS. 4C and 4D, a third insulating film 18 formed of a silicon oxide film is formed. In the present embodiment, the third insulating film 18 has a thickness of 100 nm.

Then, the third insulating film 18 is subjected to anisotropic etching, so that a side wall 19 is formed on an inner wall of the connection opening 17 in the light-shielding film 13 and on an inner wall of the second insulating film 16 surrounding a periphery of the light-receiving portion as shown in FIGS. 4E and 4F.

Finally, as shown in FIG. 4F, a tungsten (W) film is formed by sputtering or a combination of sputtering and CVD and is processed to have a desired width, thereby forming the shunt wiring 14.

At this time, in the connection opening 17 formed in the light-shielding portion 13, the side wall 19 is formed on a side wall of a portion where the second insulating film 16, the light-shielding film 13, and the first insulating film 15 are laminated. Although the thickness of the side wall 19 is slightly smaller than that of the third insulating film, i.e., 100 nm, it is sufficient relative to the minimum film thickness as considered above, i.e., 60 nm. Because of the side wall 19, an overall shape of the opening portion becomes a hollow with its upper portion broadened, which facilitates entry of the tungsten film. Further, the opening portion after the formation of the side wall 19 has a size equivalent to that obtained by subtracting the thicknesses of the two side walls 19, each being a little less than 100 nm, from 300 nm, the size of the removal pattern formed in the resist film. Therefore, it is possible to ensure a size of at least 100 nm square or more, allowing the leg portion 21 formed simultaneously with the shunt wiring 14 to reach the vertical transfer electrode 11 easily. As a result, the connection between the shunt wiring 14 and the vertical transfer electrode 11 is ensured, and it is possible to avoid reliably the problem of a contact resistance occurring between the shunt wiring 14 and the light-shielding film 13. Due to over-etching performed when the side wall 19 is formed, the thickness of the second insulating film 16 becomes smaller than its original thickness of 100 nm. However, it is easy to control this so that the thickness of the film removed by over-etching is not more than 40 nm. Therefore, even in consideration of over-etching performed when the side wall 19 is formed, the second insulating film 16 can have a thickness of 60 nm or more, posing no problem with the withstand voltage between the light-shielding film 13 and the shunt wiring 14.

As described above, due to the formation of the side wall 19, electrical insulation between the light-shielding film 13 and the leg portion 21 formed simultaneously with the shunt wiring 14 is determined by the distance between the light-shielding film 13 and the leg portion 21, in other words, the thickness of the side wall 19 formed by etching the third insulating film 18. The thickness of the side wall 19 formed in the connection opening 17 can be adjusted by controlling the thickness of the third insulating film 18. Thus, a necessary thickness can be ensured without being affected by the processing accuracy of lithography. Further, there is no need to allow for a margin of positioning of the connecting portion between the shunt wiring 14 and the vertical transfer electrode 11. Therefore, it is possible to make the light-receiving portion sufficiently large, resulting in an improved light-receiving sensitivity of the solid-state imaging device.

In general, steps are likely to remain unetched in wiring processing. However, the side wall 19 formed in the method for manufacturing the solid-state imaging device of the present embodiment reduces such steps. Accordingly, there is no need to perform excessive additional etching for preventing unetched portions, resulting in reduced etching damage caused by over-etching. As shown in the present embodiment, since the side wall 19 is formed also on the inner wall of the second insulating film 16 on the periphery of the light-receiving portion, poor image quality due to white flaws generated in the light-receiving portion, for example, can be improved.

Further, the second insulating film 16 preferably has a two-layer structure in which a silicon nitride film is laminated on a silicon oxide film, since the silicon nitride film can be used as an etching stopper in anisotropic etching performed when the side wall 19 is formed using the third insulating film 18 as a silicon oxide film.

Figure 5A:
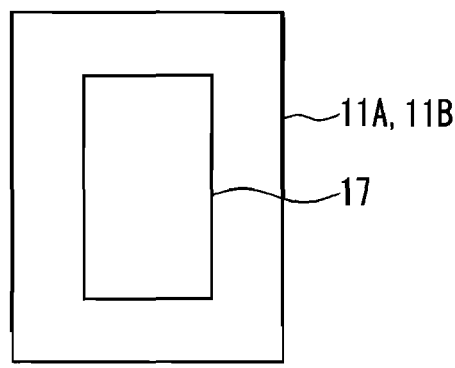
FIGS. 5A-C are views showing shapes of a connection opening of the solid-state imaging device according to the first embodiment of the present invention.
Figure 5B:
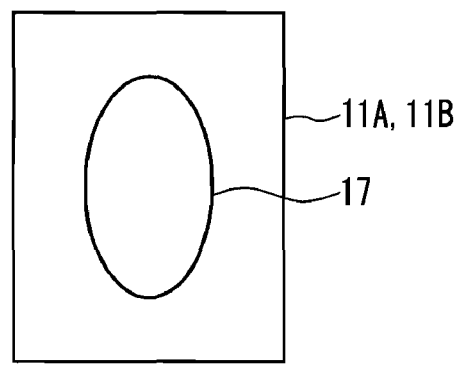
Figure 5C:
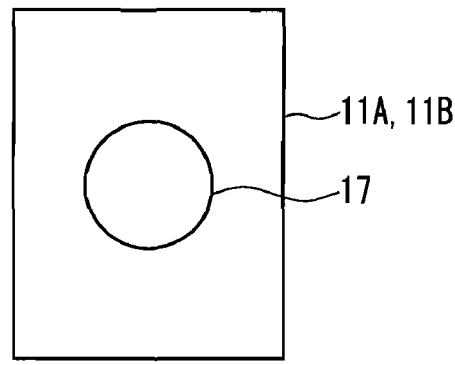

As shown in FIG. 1, the connection opening 17 in the present embodiment has a substantially square shape. However, the present invention is not limited thereto. A rectangular shape including an oblong as shown in FIG. 5A, an elliptical or oval shape as shown in FIG. 5B, and a circular shape as shown in FIG. 5C are also available. In particular, when the connection opening 17 has a shape with a long side direction and a short side direction like an oblong as shown in FIG. 5A and an elliptical or oval shape as shown in FIG. 5B, the long side direction of the connection opening 17 preferably is made substantially parallel to a direction in which the vertical transfer electrode 11A or 11B to be connected is formed. In this manner, when the long side direction of the connection opening 17 is made parallel to the direction in which the vertical transfer electrode 11 is formed, a large margin can be set when the connection opening 17 is formed. Consequently, an unwanted short circuit is less likely to occur, resulting in improved reliability. Further, the connecting portion between the shunt wiring 14 and the vertical transfer electrode 11 has a larger area, so that an electrical resistance is decreased, resulting in a higher-speed solid-state imaging device.

Second Embodiment

Figure 6:
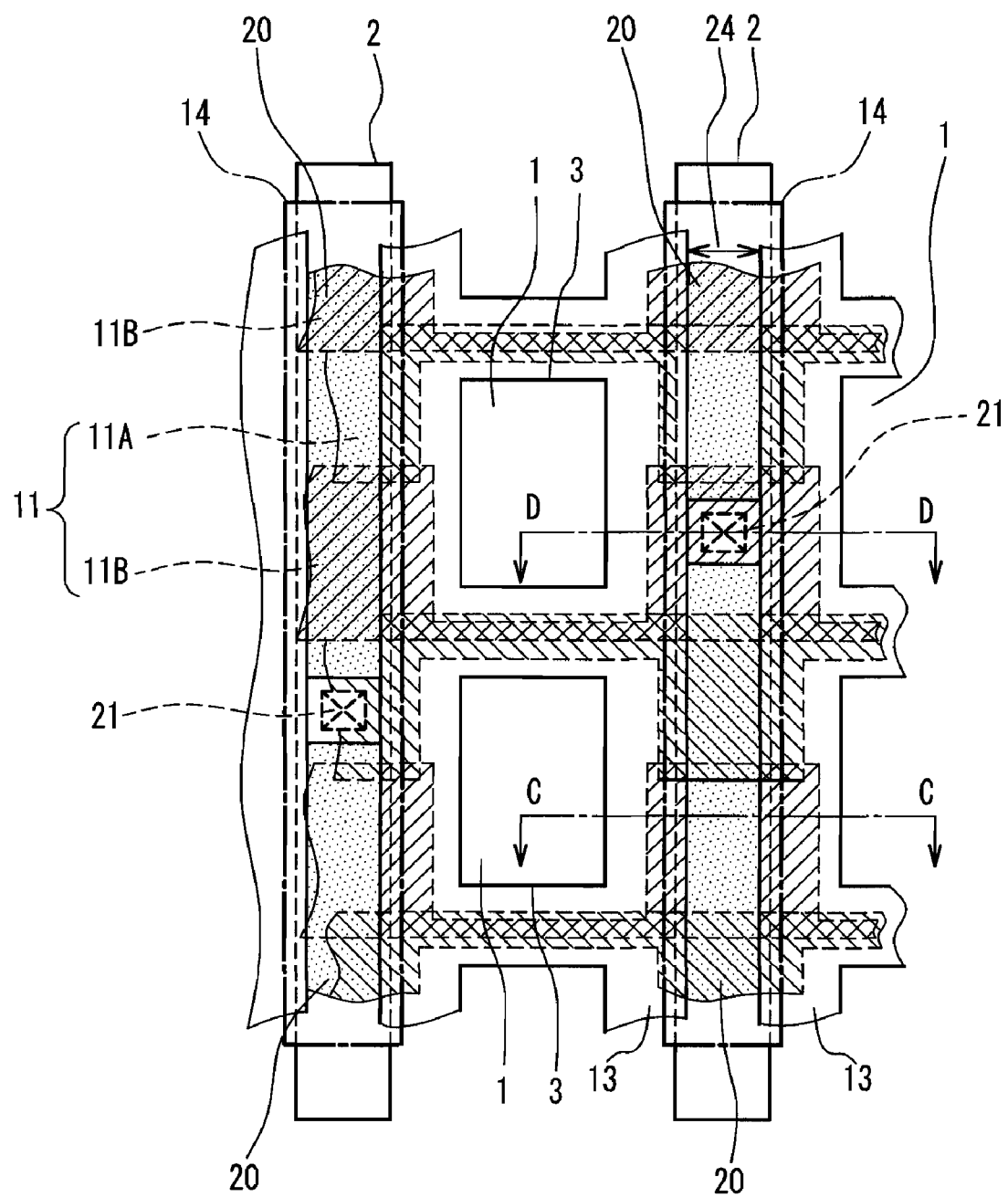
FIG. 6 is a plan view showing a configuration of an imaging portion of a solid-state imaging device according to a second embodiment of the present invention.
Figure 7A:
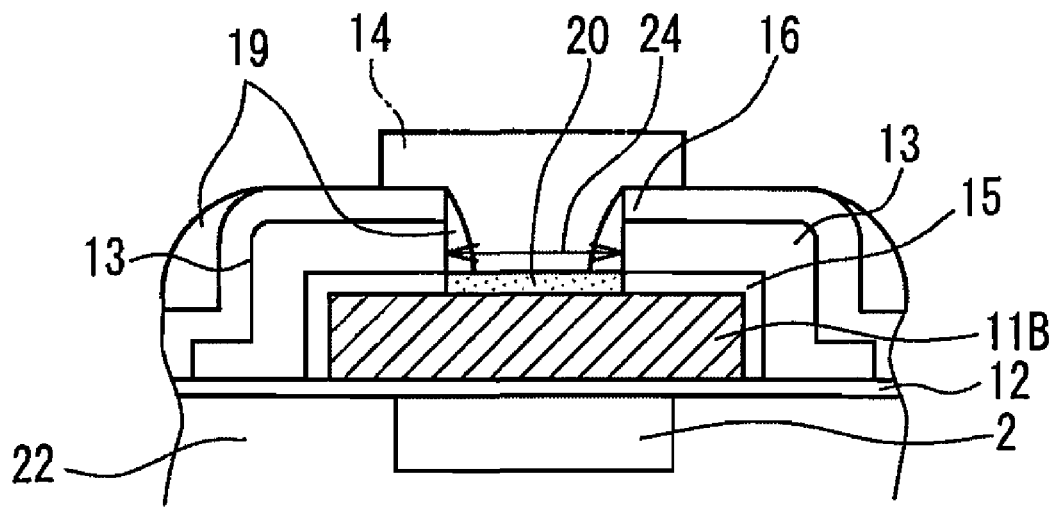
FIGS. 7A-B are schematic views showing cross-sectional configurations of the imaging portion of the solid-state imaging device according to the second embodiment of the present invention.
Figure 7B:
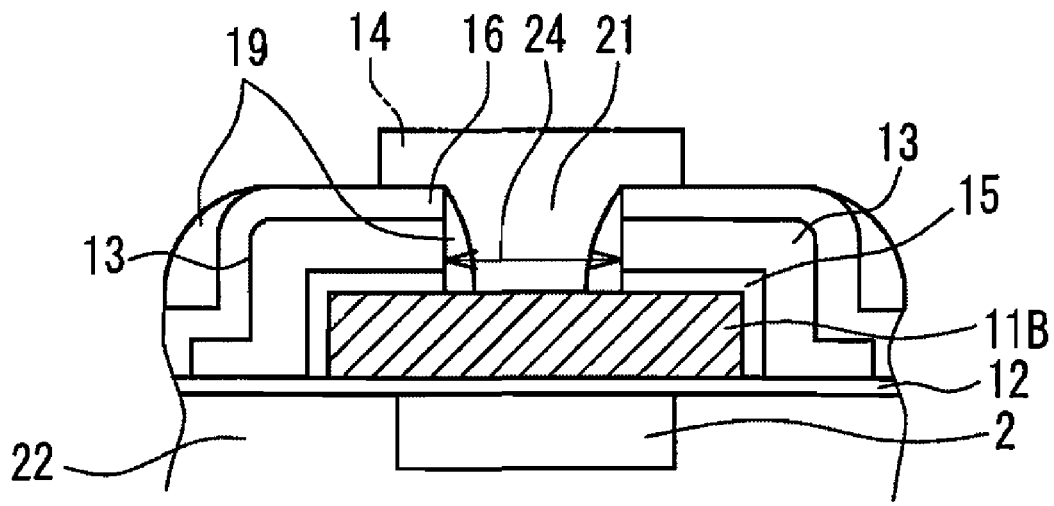

Next, a second embodiment of the present invention will be described with reference to the drawings. FIG. 6 is a plan view illustrating a main configuration of an imaging portion of a solid-state imaging device according to the second embodiment of the present invention. FIG. 7A is a schematic view showing a cross-sectional configuration taken along a line C-C in FIG. 6, and FIG. 7B is a schematic view showing a cross-sectional configuration taken along a line D-D in FIG. 6. The solid-state imaging device according to the second embodiment of the present invention as shown in FIGS. 6 and 7A-B has the same basic configuration as that of the solid-state imaging device according to the first embodiment as shown in FIGS. 1 and 2A-B. Thus, the same components are denoted with the same reference numerals, and descriptions thereof will be omitted.

As shown in FIGS. 6 and 7A-B, the solid-state imaging device of the present embodiment has slit portions 24 formed in the light-shielding film 13 on the vertical transfer channels 2 in a direction in which the vertical transfer channels 2 are formed. Further, the leg portion 21 that extends in a thickness direction of the shunt wiring 14 integrally with the shunt wiring is formed continuously in a length direction of the shunt wiring 14, i.e., a direction in which the shunt wiring 14 is formed (vertical direction in FIG. 6), and the leg portion 21 enters each of the slit portions 24 in the light-shielding film 13.

Further, a stopper layer 20 formed of a nitride film is formed on the vertical transfer electrode 11 corresponding to a bottom of each of the slit portions 24 in the light-shielding film 13, except for the connecting portion between the shunt wiring 14 and the vertical transfer electrode 11. The thickness of the stopper layer 20 is set appropriately relative to an amount of over-etching performed when the side wall 19 is formed, so that the stopper layer 20 can function as an electrically insulating layer between the leg portion 21 of the shunt wiring 14 and the vertical transfer electrode 11. Consequently, in the portion where the stopper layer 20 is formed, other than the connecting portion between the shunt wiring 14 and the vertical transfer electrode 11, no electrical continuity is established between the shunt wiring 14 and the vertical transfer electrode 11. The selectivity ratio between the third insulating layer 18 generally formed of an oxide film and the stopper layer 20 formed of a nitride film can be set to 10 or more. As described in the first embodiment, since an amount of over-etching performed when the wide wall 19 is formed is set to be not more than 40 nm, the thickness of the stopper layer 20 to be etched when the side wall 19 is formed can be set to be not more than 4 nm. Therefore, when the stopper layer 20 originally has a thickness of 50 nm, the stopper layer 20 can have a thickness of 40 nm or more even when it is over-etched. Since a nitride film has a withstand voltage at least 1.5 times higher than that of an oxide film, the nitride film having a thickness of 40 nm is equivalent to the oxide film having a thickness of 60 nm, which is the minimum film thickness as described above.

Therefore, although the leg portion 21 integral with the shunt wiring 14 enters the slit portion 24 formed in the light-shielding film 13, electrical continuity is established between the shunt wiring 14 and the vertical transfer electrode 11 only in the portion where the shunt wiring 14 and the vertical transfer electrode 11 are intended to be connected. Thus, a driving pulse according to the drive phase can be applied from the shunt wiring 14 to the predetermined vertical transfer electrode as in the solid-state imaging device shown in the first embodiment. As a result, it is possible to read out charges from the photoelectric conversion portion 1 without being influenced by an electrical resistance of the vertical transfer electrode 11.

In the solid-state imaging device according to the present embodiment, the leg portion 21 integral with the shunt wiring 14 is formed over the entire length of the shunt wiring 14, which means that the thickness of the shunt wiring 14 as a whole including the leg portion 21 becomes larger. Consequently, it is possible to decrease a resistance of the shunt wiring 14, and thus to suppress significantly a loss of a driving pulse applied to the vertical transfer electrode 11 as appropriate. As a result, a lower-power solid-state imaging device can be achieved. Further, due to a low resistance of the shunt wiring 14, the solid-state imaging device can be driven at a higher speed.

Further, since the leg portion 21 integral with the shunt wiring 14 enters the slit portion 24 formed in the light-shielding film 13, it is possible to reduce film peeling of the shunt wiring 14.

In the solid-state imaging device according to the present embodiment, the leg portion 21 and the light-shielding film 13 are close to each other only in a width direction of the slit portion 24 perpendicular to a length direction, i.e., a horizontal direction in FIGS. 7A and 7B. For this reason, in order to avoid contact therebetween, it is important to position the leg portion 21 at the center of the slit portion 24 in the width direction. Also in the solid-state imaging device according to the present embodiment, in order to avoid contact between the leg portion 21 integral with the shunt wiring 14 and the light-shielding film 13, it is more preferable to form a side wall on a side surface of the slit portion 24 in its long side direction.

Hereinafter, a method for manufacturing the solid-state imaging device according to the present embodiment will be described with reference to FIGS. 8A-D and 9A-F. Similarly to FIGS. 3A-D and 4A-F in the first embodiment 1, FIGS. 8A, 8C, 9A, 9C, and 9E show cross-sectional configurations of the portion where the stopper layer 20 is formed, other than the connecting portion between the shunt wiring 14 and the second vertical transfer electrode 11B, taken along a line C-C in FIG. 6. FIGS. 8B, 8D, 9B, 9D, and 9F show cross-sectional configurations of the connecting portion between the shunt wiring 14 and the second vertical transfer electrode 11B where the stopper layer 20 is not formed, taken along a line D-D in FIG. 6.

Figure 8A:
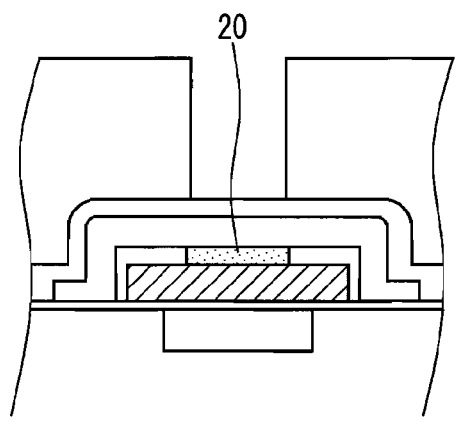
FIGS. 8A-D are cross-sectional configuration views for illustrating a method for manufacturing the solid-state imaging device according to the second embodiment of the present invention.
Figure 8B:
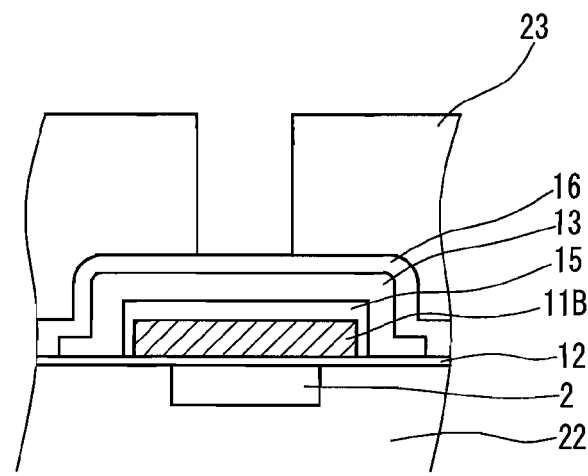

In the states shown in FIGS. 8A and 8B, manufacturing processes already have been conducted up to the formation of the second insulating film 16. More specifically, on the semiconductor substrate 22, the photoelectric conversion portion not shown and the vertical transfer channel 2 in the vertical inter-column portion of the photoelectric conversion portion have been formed, on which the patterned vertical transfer electrode 11, the first insulating film 15, the light-shielding film 13, and the second insulating film 16 have been laminated sequentially via the surface oxide film 12.

As shown in FIGS. 8A and 8B, a resist film 23 is formed on the second insulating film 16. The resist film 23 corresponding to the portion where the slit portion 24 in the light-shielding film 13 is formed later in the direction in which the vertical transfer channel 2 is formed is patterned and removed. In the solid-state imaging device according to the present embodiment, since the slit portion 24 is formed continuously as described above, the resist film 23 is removed with the same width in both the connecting portion between the shunt wiring and the vertical transfer electrode as shown in FIG. 8B and the portion as shown in FIG. 8A.

In the portion other than the connecting portion between the shunt wiring and the vertical transfer electrode shown in FIG. 8A, the stopper layer 20 is formed previously on the vertical transfer electrode 11 so as to have a width equal to or slightly larger than the width of the portion where the resist film 23 is removed, i.e., a width of the slit to be formed later in the light-shielding film 13. When the stopper layer 20 is formed so as to cover the vertical transfer electrode 11 without the connection entirely, it is possible to set a larger margin of positional displacement.

Figure 8C:
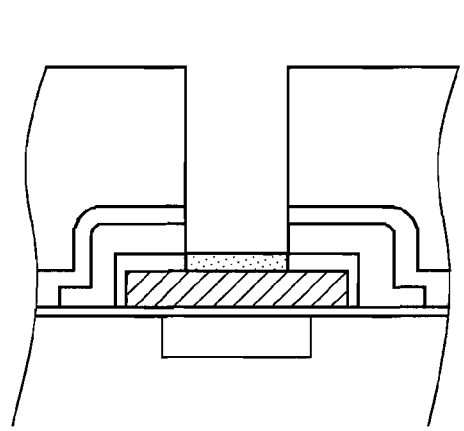
Figure 8D:
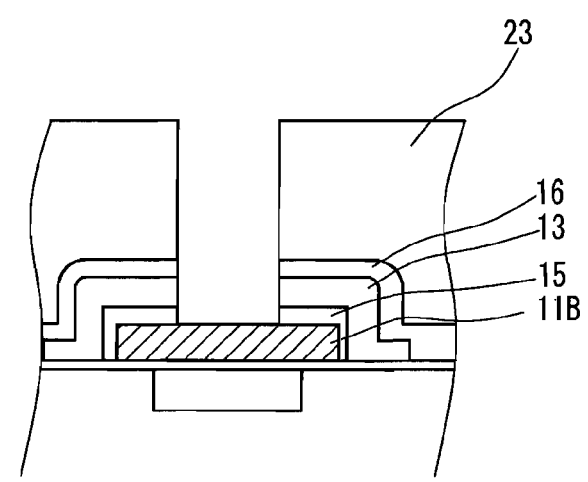

Then, as shown in FIGS. 8C and 8D, the resist film 23 is used as a mask so as to form a slit-shaped opening in the second interlayer insulating film 16, the light-shielding film 13, and the first interlayer insulating film 15. Etching is performed to form the opening. However, in the portion shown in FIG. 8C where the stopper layer 20 that serves as an etching stopper is formed, etching is stopped so as to form no opening in the stopper layer 20.

Figure 9A:
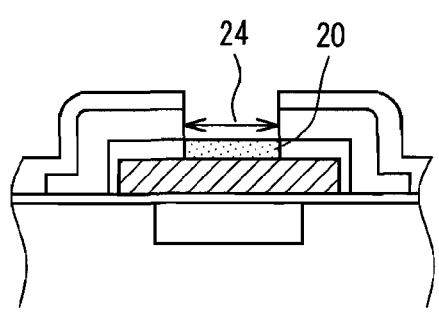
FIGS. 9A-F are cross-sectional configuration views subsequent to FIGS. 8A-D for illustrating the method for manufacturing the solid-state imaging device according to the second embodiment of the present invention.
Figure 9B:
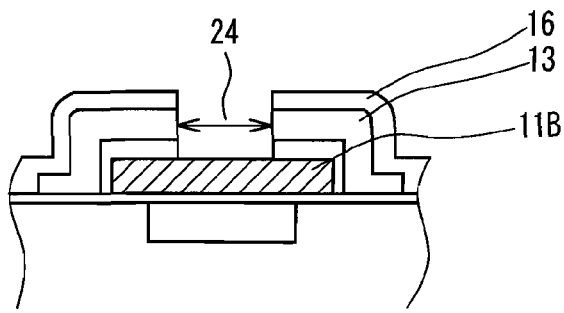

Thereafter, as shown in FIGS. 9A and 9B, the resist film 23 is removed. Here, the opening formed in the light-shielding film 13 serves as the slit portion 24 in the light-shielding film 13.

Figure 9C:
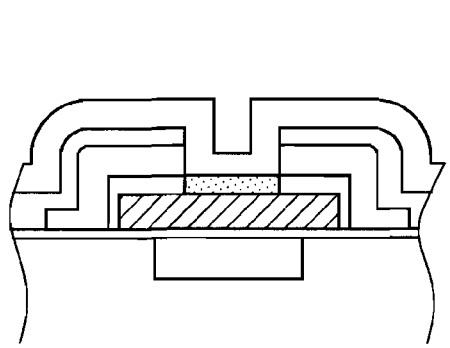
Figure 9D:
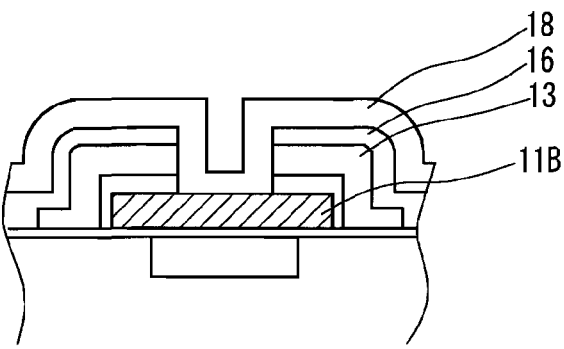

After that, as shown in FIGS. 9C and 9D, the third insulating film 18 formed of a silicon oxide film is formed.

Figure 9E:
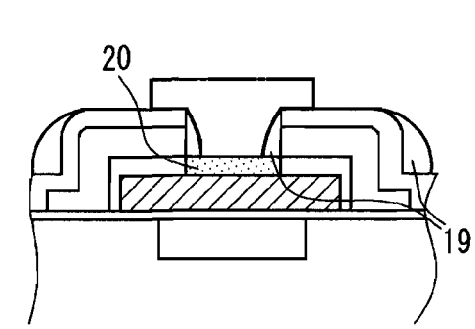
Figure 9F:
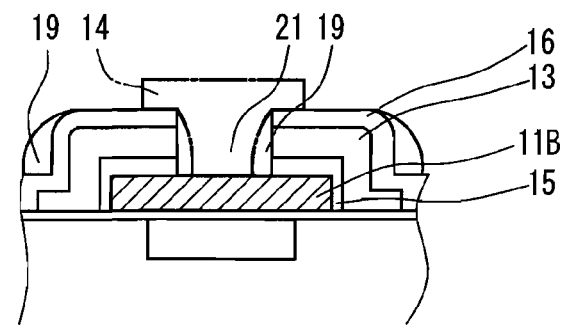

Then, the third insulating film 18 is subjected to anisotropic etching, so that the side wall 19 is formed on an inner side wall corresponding to a side surface of the slit portion 24 in the light-shielding film 13 in its long side direction and on an inner wall of the second insulating film 16 surrounding a periphery of a light-receiving portion as shown in FIGS. 9E and 9F. At this time, when the etching rate of the third insulating layer 18 formed of an oxide film is made higher than that of the stopper layer 20 formed of a nitride film as described above, the stopper layer 20 can remain as it is at the bottom of the slit portion 24 after the process of forming the side wall 19.

Finally, as shown in FIG. 9F, a tungsten (W) film is formed by sputtering or a combination of sputtering and CVD and is processed to have a desired width for insulation, thereby forming the shunt wiring 14. At this time, because of the side wall 19, the slit portion 24 has a hollow shape with its upper portion broadened. Thus, the tungsten film easily enters the leg portion 21 formed simultaneously with the shunt wiring 14 and reaches the bottom of the slit portion 24. As a result, in the connecting portion shown in FIG. 9F, the shunt wiring 14 and the vertical transfer electrode 11 can be connected reliably. In the portion shown in FIG. 9E, the leg portion 21 reliably reaches the stopper layer 20 that also serves as an insulating film between the shunt wiring 14 and the vertical transfer electrode 11. As a result, it is possible to prevent effectively an adverse effect of a contact resistance generated between the shunt wiring 14 and the vertical transfer electrode 11, as well as to reduce reliably film peeling of the shunt wiring 14 that occurs, due to the structure in which the leg portion 21 enters the slit portion 24.

Also in the present embodiment, the second insulating film 16 and the third insulating film 18 each have a thickness of 100 nm, the opening of the slit has a width of 300 nm, and an amount of over-etching performed when the side wall 19 is formed is controlled appropriately as described in the first embodiment. Consequently, sufficient insulation can be kept between the shunt wiring 14 as well as the leg portion 21 and the vertical transfer electrode 11 or the light-shielding film 13.

Further, similar to the solid-state imaging device according to the first embodiment, it is also possible to improve poor image quality due to white flaws generated in the light-receiving portion, for example, since the side wall 19 reduces steps, and to ensure insulation between the light-shielding film 13 and the leg portion 21 integral with the shunt wiring 14 by properly defining the distance therebetween.

Also in the present embodiment, the leg portion 21 has a substantially square cross-sectional shape, and the region where the stopper layer 20 is not formed also has a substantially square shape as shown in FIG. 6. However, the present invention is not limited thereto. In the first embodiment, an oblong shape, an elliptical shape, an oval shape, and a circular shape are shown in FIGS. 5A-C as modified examples of the shape of the connection opening 17. The cross-sectional shape of the leg portion 21 and the shape of the region where the stopper layer 20 is not formed in the present embodiment also may be as shown in FIGS. 5A-C. Further, similarly to the first embodiment, when the leg portion 21 and the region where the stopper layer 20 is not formed each have an oblong or oval shape, and their long side directions are made parallel to a direction in which the vertical transfer electrode 11 is formed, a higher-speed solid-state imaging device with improved reliability can be achieved.

As described above, since the solid-state imaging device according to the present embodiment can achieve the same effect as that obtained by increasing the thickness of the shunt wiring 14, an effective resistance of the shunt wiring 14 can be decreased. Thus, by using the solid-state imaging device according to the present embodiment, it is possible to realize a high-quality still camera or video camera that can be driven at a high speed or operated with low power consumption. Since the shunt wiring 14 has a larger cross-sectional area as described above, the shunt wiring 14 can have a smaller width with its resistance kept. Accordingly, when the driving frequency is not increased, imaging pixels can be made much smaller.

Figure 10:
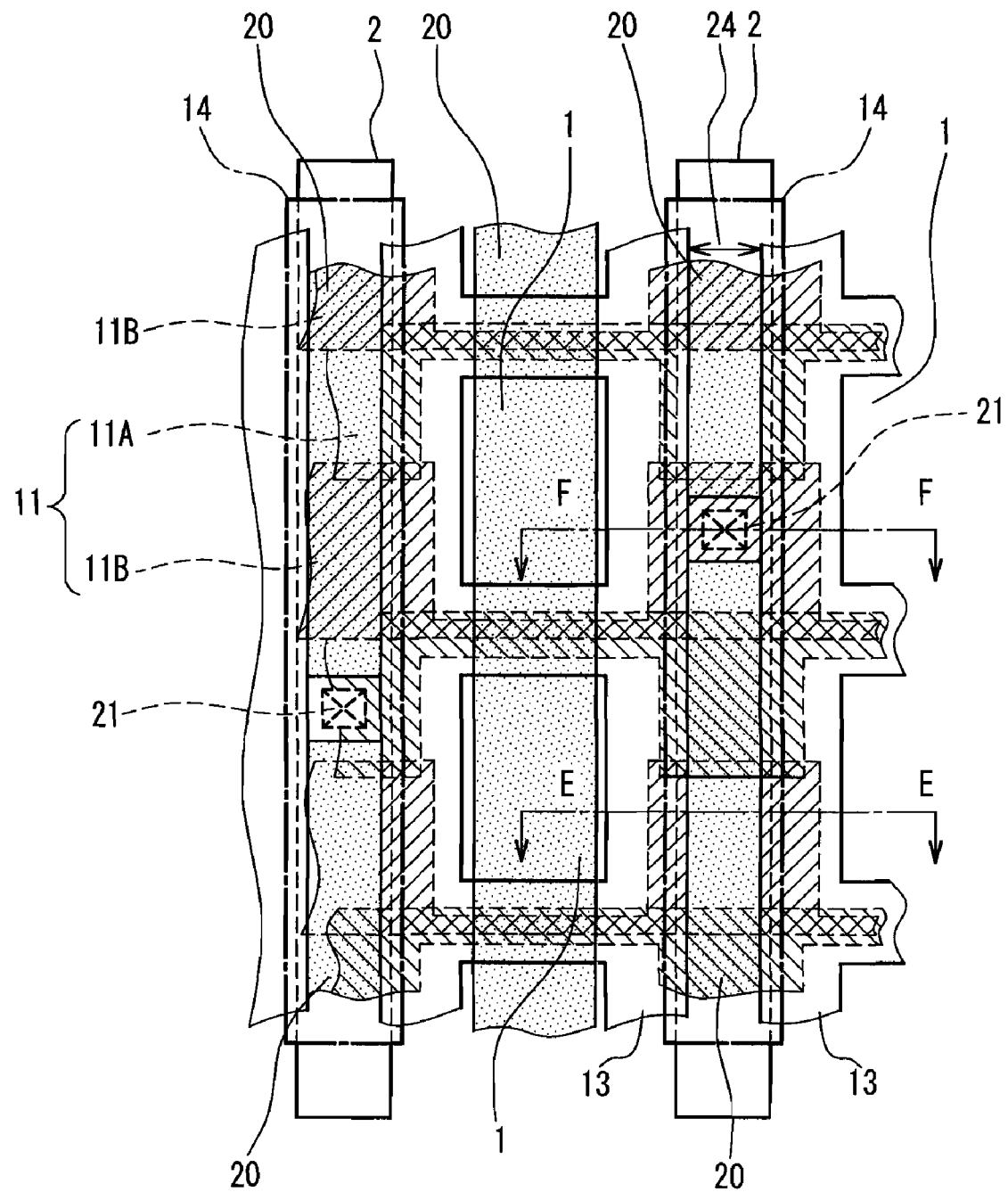
FIG. 10 is a plan view showing a configuration of an imaging portion of a solid-state imaging device as an application example of the second embodiment of the present invention.
Figure 11A:
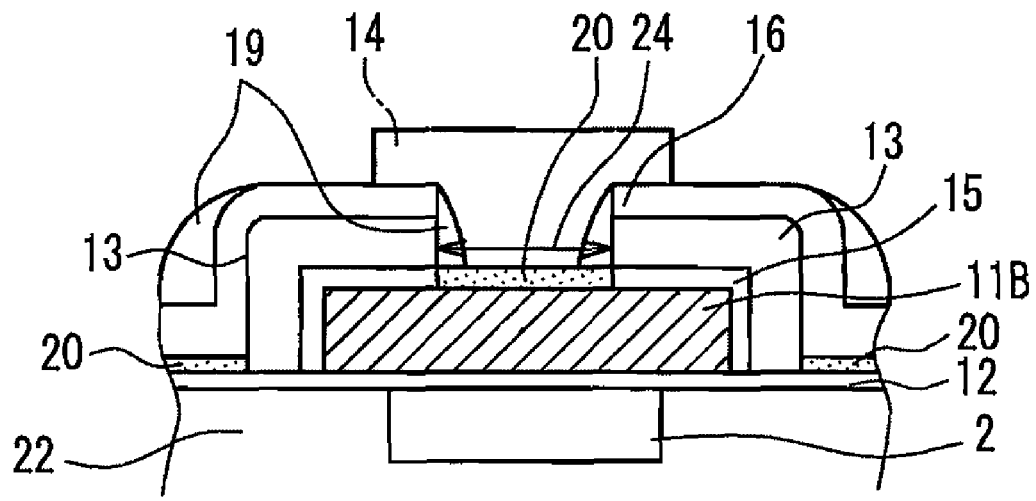
FIGS. 11A-B are schematic views showing cross-sectional configurations of the imaging portion of the solid-state imaging device as the application example of the second embodiment of the present invention.
Figure 11B:
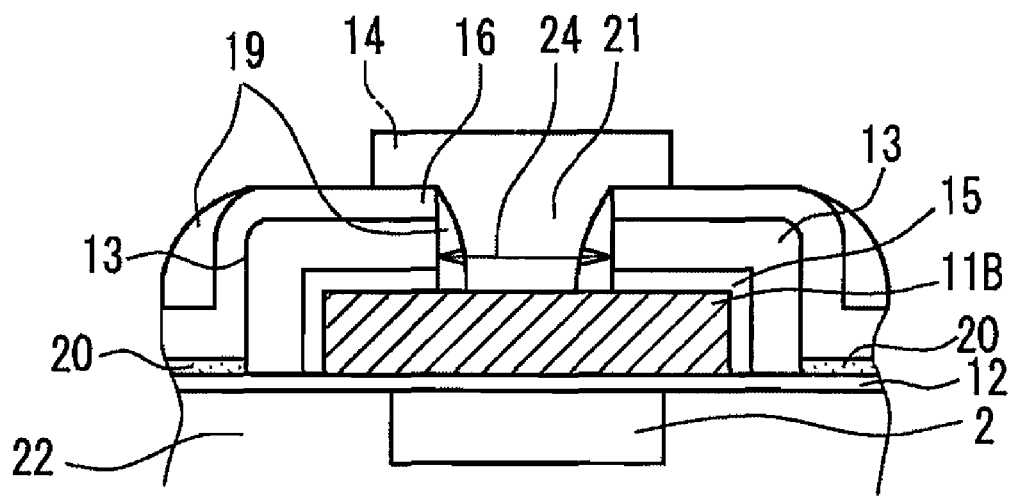
Figure 12:
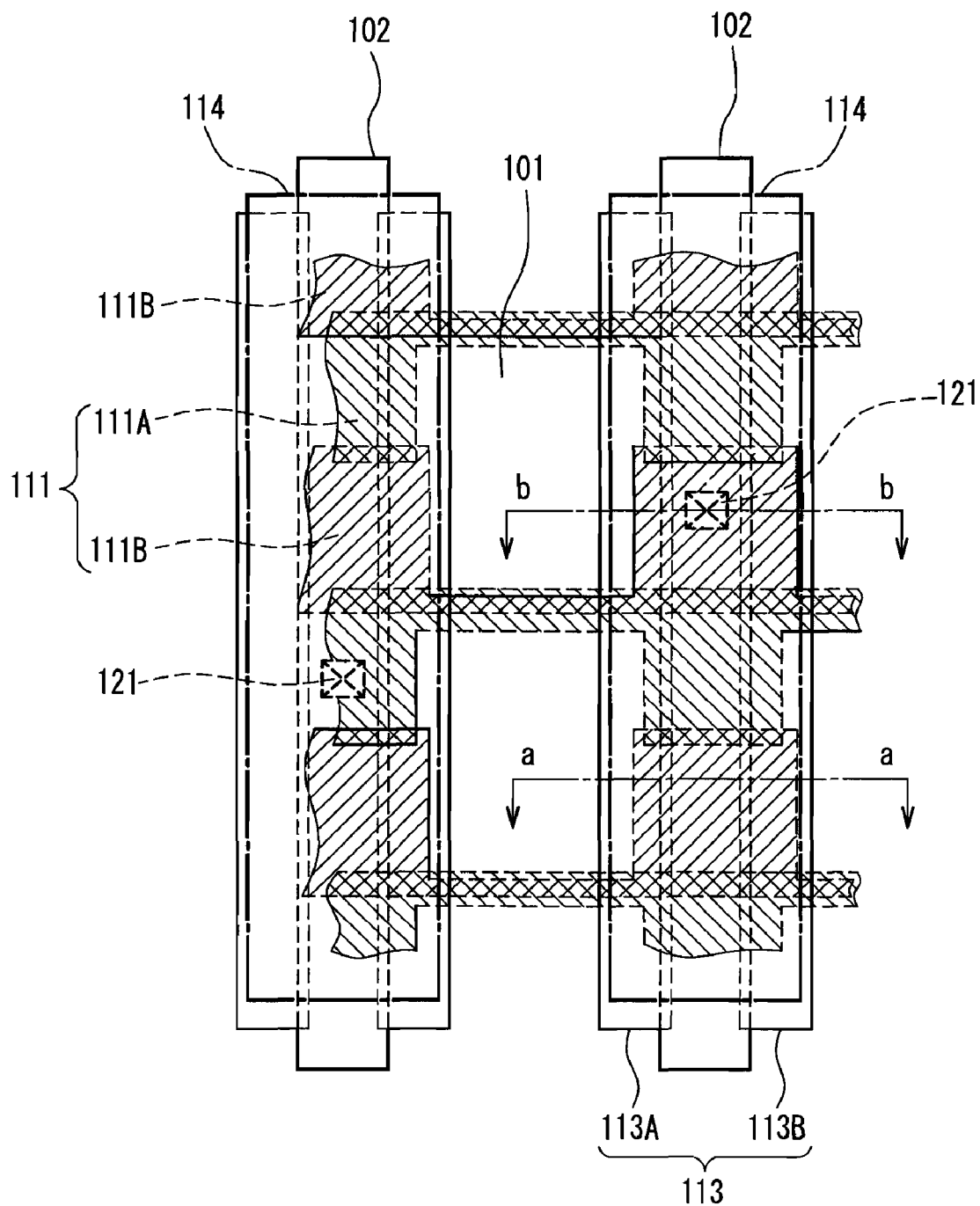
FIG. 12 is a plan view showing a configuration of an imaging portion of a conventional solid-state imaging device.
Figure 13A:
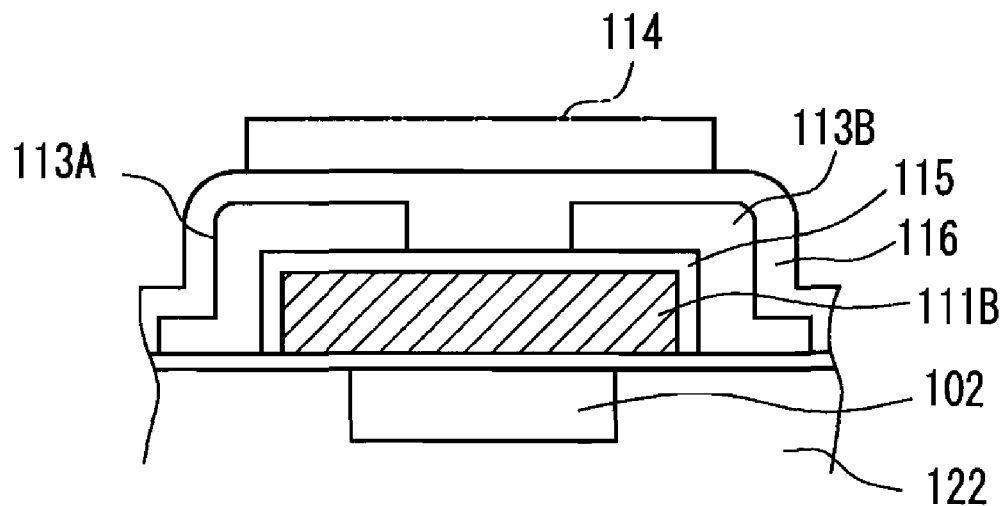
FIGS. 13A-B are schematic views showing cross-sectional configurations of the imaging portion of the conventional solid-state imaging device.
Figure 13B:
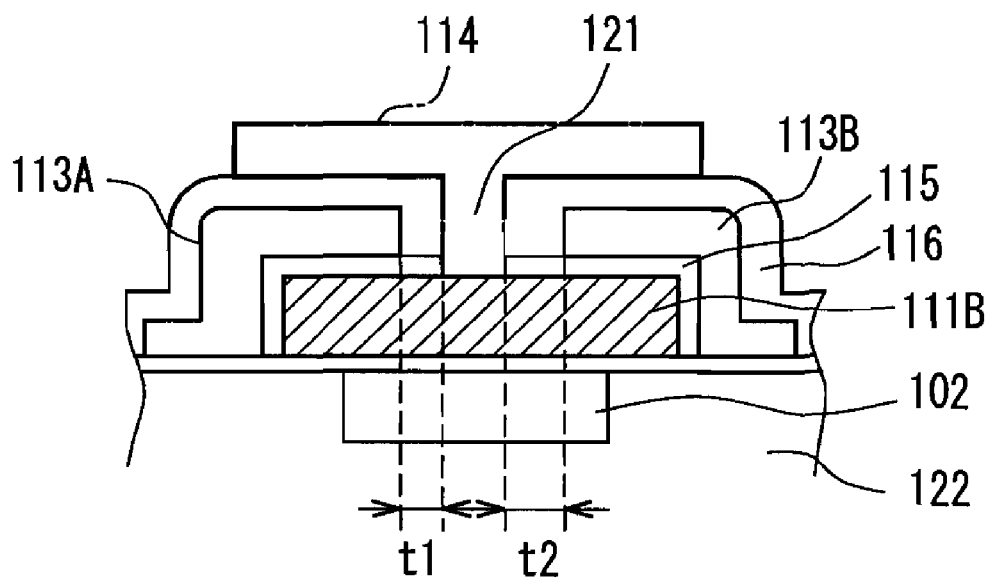

Next, an application example of the solid-state imaging device according to the present embodiment will be described with reference to FIGS. 10 and 11A-B. FIG. 10 is a plan view illustrating a main configuration of the application example of the solid-state imaging device according to the present embodiment. FIG. 11A is a schematic view showing a cross-sectional configuration taken along a line E-E in FIG. 10, and FIG. 11B is a schematic view showing a cross-sectional configuration taken along a line F-F in FIG. 10. The application example of the solid-state imaging device according to the present embodiment as shown in FIGS. 10 and 11A-B has the same basic configuration as that of the solid-state imaging device according to the second embodiment as shown in FIGS. 7A-B and 8A-D. Thus, the same components are denoted with the same reference numerals, and descriptions thereof will be omitted.

According to the application example shown in FIGS. 10 and 11A-B, a silicon nitride film is selected for the stopper layer 20 when the third insulating film 18 is formed of a silicon oxide film in the solid-state imaging device according to the second embodiment. As shown in FIGS. 10 and 11A-B, the stopper layer 20 is formed not only on the vertical transfer electrode 11 corresponding to the bottom of the slit portion 24 in the light-shielding film 13, but also on the surface oxide film 12 in the portion where the photoelectric conversion portion 1 is formed on the semiconductor substrate 22.

A silicon nitride film has a refractive index n of about 2, which is between a refractive index n of about a little less than 5 of the photoelectric conversion portion in the case of a silicon substrate and a refractive index n of about a little less than 1.5 at an interface of the surface oxide film 12. Thus, a silicon nitride film can function as an antireflection film. Therefore, only by modifying a mask pattern for forming the stopper layer 20, it is possible to achieve a solid-state imaging device with a much higher sensitivity having an antireflection film as shown in the application example.

In the above, the solid-state imaging device and the method for manufacturing the same according to the present invention have been described by way of embodiments. However, the present invention is not limited to these embodiments.

For example, according to the embodiments as described above, the first vertical transfer electrode 11A and the second vertical transfer electrode 11B overlap each other as shown in the figures. However, these vertical transfer electrodes may have a single layer structure without an overlap. Also in that case, it is possible to make imaging pixels finer in the vertical direction of the solid-state imaging device, i.e., the column direction of the photoelectric conversion portion, as well as to achieve the particular effect of the present invention.

According to the solid-state imaging device and the method for manufacturing the same according to the present invention, it is possible to realize a solid-state imaging device that can achieve a high imaging sensitivity, high-speed signal processing, and high image quality, and the present invention is useful for a solid-state imaging device, in particular, a CCD solid-state imaging device for use in a digital camera or a video camera.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid-state imaging device comprising:
   a plurality of photoelectric conversion portions arranged in a matrix on a substrate;
   a vertical transfer channel arranged between vertical columns of the photoelectric conversion portions;
   a plurality of vertical transfer electrodes for transferring a charge of the photoelectric conversion portions to the vertical transfer channel;
   a light-shielding film, laminated on the vertical transfer electrodes via a first insulating film, is divided by a slit portion formed in the region overlapping the vertical transfer channel with respect to each of the vertical columns of the photoelectric conversion portions, and has a plurality of window portions, each defining a light-receiving portion of each of the photoelectric conversion portions;
   a stopper layer lamented on the vertical transfer electrodes corresponding to a bottom of the slit portion;
   a shunt wiring that is arranged in a region overlapping the vertical transfer channel and is insulated from the light-shielding film by a second insulating film;
   a connection opening formed in the stopper layer in the slit portion of the light-shielding film and the second insulating film;
   a side wall member, formed separately from the second insulating film, and formed on the side face of the connection opening and the side surface of the slit portion in the light-shielding film in its long side direction; and
   a leg portion is formed continuously in a direction in which the shunt wiring is arranged and enters the slit portion,
   wherein a driving pulse according to a drive phase of each of the vertical transfer electrodes is supplied from the shunt wiring.

2. The solid-state imaging device according to claim 1, wherein an antireflection film made of the same material as that for the stopper layer is formed in the light-receiving portion.

3. The solid-state imaging device according to claim 1, wherein the connection opening has any one of a circular shape, an elliptical shape, and a rectangular shape.

4. The solid-state imaging device according to claim 1, wherein the leg portion is positioned at a center of the connection opening.

5. The solid-state imaging device according to claim 1, wherein the vertical transfer electrodes have a single layer structure.

6. The solid-state imaging device according to claim 1, wherein the vertical transfer electrodes are made of polysilicon.

7. The solid-state imaging device according to claim 1, wherein the light-shielding film is made of tungsten.

8. The solid-state imaging device according to claim 1, wherein the shunt wirings are made of tungsten.

9. The solid-state imaging device according to claim 1, wherein a thickness of the side wall member is 60 nm or more.

10. The solid-state imaging device according to claim 1, wherein the stopper layer is made of polysilicon.

* * * * *